US010229852B2

(12) United States Patent
Pranatharthiharan et al.

(10) Patent No.: US 10,229,852 B2
(45) Date of Patent: Mar. 12, 2019

(54) SELF-ALIGNED LOW DIELECTRIC CONSTANT GATE CAP AND A METHOD OF FORMING THE SAME

(71) Applicant: International Business Machines Corporation, Armonk, NY (US)

(72) Inventors: Balasubramanian Pranatharthiharan, Watervliet, NY (US); Injo Ok, Loudonville, NY (US); Charan V. V. S. Surisetty, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/837,236

(22) Filed: Dec. 11, 2017

(65) Prior Publication Data

US 2018/0090375 A1    Mar. 29, 2018

Related U.S. Application Data

(63) Continuation of application No. 14/970,120, filed on Dec. 15, 2015, now Pat. No. 9,905,463.

(51) Int. Cl.
*H01L 21/768* (2006.01)
*H01L 21/02* (2006.01)
(Continued)

(52) U.S. Cl.
CPC .. *H01L 21/76897* (2013.01); *H01L 21/02164* (2013.01); *H01L 21/02203* (2013.01);
(Continued)

(58) Field of Classification Search
CPC .............. H01L 29/4916; H01L 29/495; H01L 29/4966; H01L 29/518; H01L 21/02164;
(Continued)

(56) References Cited

U.S. PATENT DOCUMENTS 9,905,463  B2     2/2018  Pranatharthiharan et al.
2007/0173073  A1*  7/2007  Weber .............. H01L 21/02203
                                                            438/787

(Continued)

OTHER PUBLICATIONS

List of IBM Patents or Patent Applications Treated as Related (Appendix P); Filed Jun. 11, 2018; 2 pages.

*Primary Examiner* — Kenneth Parker
*Assistant Examiner* — Long H Le
(74) *Attorney, Agent, or Firm* — Cantor Colburn LLP; Jennifer Anda

(57) ABSTRACT

According to an embodiment of the present invention, self-aligned gate cap, comprises a gate located on a substrate; a gate cap surrounding a side of the gate; a contact region self-aligned to the gate; and a low dielectric constant oxide having a dielectric constant of less than 3.9 located on top of the gate. According to an embodiment of the present invention, a method of forming a self-aligned contact comprises removing at least a portion of an interlayer dielectric layer to expose a top surface of a gate cap located on a substrate; recessing the gate cap to form a recessed area; depositing a low dielectric constant oxide having a dielectric constant of less than 3.9 in the recessed area; and polishing a surface of the low dielectric constant oxide to expose a contact area.

1 Claim, 4 Drawing Sheets

(51) Int. Cl.
    *H01L 29/49*       (2006.01)
    *H01L 29/51*       (2006.01)
    *H01L 21/311*      (2006.01)
    *H01L 23/485*      (2006.01)
    *H01L 29/417*      (2006.01)

(52) U.S. Cl.
    CPC ... *H01L 21/31111* (2013.01); *H01L 21/31116* (2013.01); *H01L 21/76801* (2013.01); *H01L 21/76885* (2013.01); *H01L 23/485* (2013.01); *H01L 29/41783* (2013.01); *H01L 29/495* (2013.01); *H01L 29/4916* (2013.01); *H01L 29/4966* (2013.01); *H01L 29/518* (2013.01)

(58) Field of Classification Search
    CPC ......... H01L 21/02203; H01L 21/31111; H01L 21/31116; H01L 21/76897
    See application file for complete search history.

(56)           References Cited

U.S. PATENT DOCUMENTS

| | | |
|---|---|---|
| 2015/0021683 A1 | 1/2015 | Xie et al. |
| 2015/0255556 A1 | 9/2015 | Cheng et al. |
| 2015/0364378 A1* | 12/2015 | Xie .................. H01L 21/82343 257/368 |
| 2016/0163585 A1* | 6/2016 | Xie .................. H01L 21/76843 257/368 |
| 2017/0148874 A1 | 5/2017 | Ok et al. |
| 2018/0082895 A1 | 3/2018 | Pranatharthiharan et al. |

* cited by examiner

SELF-ALIGNED LOW DIELECTRIC CONSTANT GATE CAP AND A METHOD OF FORMING THE SAME

DOMESTIC AND/OR FOREIGN PRIORITY

This application is a continuation of U.S. application Ser. No. 14/970,120, titled "SELF-ALIGNED LOW DIELECTRIC CONSTANT GATE CAP AND A METHOD OF FORMING THE SAME" filed Dec. 15, 2015, the contents of which are incorporated by reference herein in its entirety.

BACKGROUND

The present invention relates to a self-aligned, low dielectric constant gate cap and a method of forming the same.

Integrated circuits can comprise a large number of circuit elements such as transistors. While significant progress has been made over recent decades with respect to increased performance and reduced feature size of circuit elements, there is an ongoing demand for enhanced functionality of electronic devices, a continuous desire to reduce the dimensions of the circuit elements, and a desire to continue to increase the operating speed of the circuit elements.

With continuous transistor scaling, gate-to-drain and gate-to-source capacitance increases due to the increased proximity of the source and drain metallization contacts (vias) to the gate conductor. For instance, the distance between the contact via and the gate conductor can be as little as 40 nanometers or less in dense logic circuits. With misalignment of the contact via with respect to the gate, the spacing between the gate and the via can be significantly less than 40 nm. To make matters worse, due to Miller effect, the capacitance between the gate and drain via is multiplied by the gain of the complementary metal oxide semiconductor stage.

As a result, the total gate-to-drain and gate-to-source capacitance becomes a significant portion of the overall load capacitance for fast, lightly loaded semiconductor circuits with transistors fabricated, for example, in 7 nm technology and below. By reducing the total gate-to-drain and gate-to-source capacitance, a significant leverage in increasing circuit speed can be realized.

In view of the above, there is still a need for providing a self-aligned gate cap with a reduced capacitance.

SUMMARY

According to an embodiment of the present invention, self-aligned gate cap, comprises a gate located on a substrate; a gate cap surrounding a side of the gate; a contact region self-aligned to the gate; and a low dielectric constant oxide having a dielectric constant of less than 3.9 located on top of the gate.

According to an embodiment of the present invention, a method of forming a self-aligned contact comprises removing at least a portion of an interlayer dielectric layer to expose a top surface of a gate cap located on a substrate; recessing the gate cap to form a recessed area; depositing a low dielectric constant oxide having a dielectric constant of less than 3.9 in the recessed area; and polishing a surface of the low dielectric constant oxide to expose a contact area.

DETAILED DESCRIPTION

Figure 1:
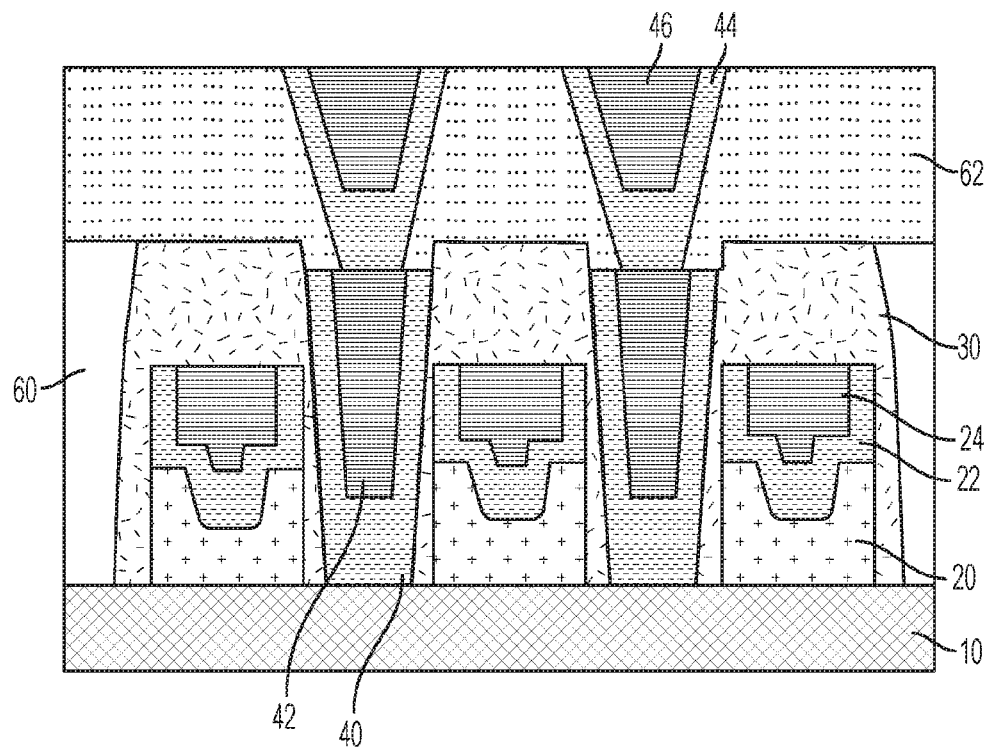
FIG. 1 is an illustration of an embodiment of a self-aligned gate cap.

Integrated circuits can include field effect transistors (FETs) that can be operated in a switched mode, where these devices can exhibit a highly conductive state (on-state) and a high impedance state (off-state). The state of the field effect transistor can be controlled by a gate electrode, which controls, upon application of an appropriate control voltage, the conductivity of a channel region formed between a drain region and a source region.

In order to connect the circuit elements formed in the semiconductor material with the metallization layers, a vertical contact structure can be provided having a first end that can be connected to a respective contact region of a circuit element, such as one or both of a gate electrode and the drain and source regions of transistors, and a second end that can be connected to a respective metal line in the metallization layer by a conductive via.

In some applications, the second end of the contact structure can be connected to a contact region of a further semiconductor-based circuit element, in which case the interconnect structure in the contact level can also be referred to as a local interconnect. The contact structure can comprise contact elements having a generally square-like or round shape that can be formed in an interlayer dielectric material, which in turn encloses and passivates the circuit elements. As the critical dimensions of the circuit elements in the device level are decreased, the dimensions of metal lines, vias, and contact elements are also reduced.

Self-aligned gates can be used to mitigate the need to align the gate electrode to the source and drain regions of metal oxide semiconductor transistors during the fabrication process. With self-aligned gates the parasitic overlap capacitances between gate and source, and gate and drain are substantially reduced, leading to metal oxide semiconductor transistors that are faster, smaller and more reliable than transistors made without them. In order to further reduce the capacitance in a self-aligned gate cap, it was discovered that a portion of the interlayer dielectric layer and a portion of the cap in a self-aligned gate cap can be replaced with a low dielectric constant oxide material. For example, the self-aligned gate cap can comprise a gate located on a substrate; a gate cap surrounding a side of the gate; a contact region self-aligned to the gate; and a low dielectric constant oxide having a dielectric constant of less than 3.9 located on top of the gate.

FIGS. 1-5 illustrate an embodiment of the present invention for fabricating the self-aligned gate cap have the reduced capacitance.

In the figures, semiconductor substrate 10 can comprise a semiconducting material. Semiconductor substrate 10 can comprise silicon, germanium, carbon, gallium, arsenic, indium, phopshorus, a remaining Group III or V compound, or a combination comprising at least one of the foregoing. Examples of semiconducting materials include silicon (Si), germanium (Ge), silicon germanium (SiGe), silicon carbide (SiC), silicon germanium carbon (SiGeC), gallium (Ga), gallium arsenide (GaAs), indium arsenide (InAs), and indium phosphide (InP). Semiconductor substrate 10 can comprise an organic semiconductor or a layered semiconductor such as Si/SiGe, a semiconductor-on-insulator (such as silicon-on-insulator or a SiGe-on-insulator).

Semiconductor substrate 10 can be doped or undoped or can contain doped and undoped regions therein. Semiconductor substrate 10 can comprise a first doped (n- or p-) region, and a second doped (n- or p-) region. The first doped region and the second doped region can be the same, or they can have different conductivities and/or doping concentrations. These doped regions are known as "wells".

A gate dielectric layer can be formed on the surface of semiconductor substrate 10. The gate dielectric layer can be formed by a thermal growing process such as, for example, oxidation, nitridation, or oxynitridation. Alternatively, the gate dielectric can be formed by a deposition process such as, for example, chemical vapor deposition (CVD), plasma-assisted CVD, atomic layer deposition (ALD), evaporation, reactive sputtering, chemical solution deposition or other like deposition processes. The physical thickness of the gate dielectric layer can be 0.5 to 10 nanometers, specifically, 0.5 to 3 nanometers.

The gate dielectric layer can comprise an insulating material including, but not limited to an oxide, nitride, oxynitride, a silicate including metal silicates and nitrided metal silicates, or a combination comprising at least one of the foregoing. The gate dielectric layer can comprise an oxide such as, silicon dioxide ($SiO_2$), hafnium dioxide ($HfO_2$), zirconium dioxide ($ZrO_2$), aluminum oxide ($Al_2O_3$), titanium dioxide ($TiO_2$), lanthanum oxide ($La_2O_3$), strontium titanate ($SrTiO_3$), lanthanum aluminate ($LaAlO_3$), or a combination comprising at least one of the foregoing.

One or more gates can be located on semiconductor substrate 10. The gate can comprise one or more layers of each independently comprising silicon, aluminum, carbon, nitrogen, titanium, tantalum, tungsten, germanium, or a combination comprising at least one of the foregoing. For example, the one or more layers can each independently comprise titanium (Ti), titanium nitride (TiN), titanium-aluminum (TiAl), titanium aluminum nitride (TiAlN), titanium-aluminum-carbon (TiAlC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi), tungsten, or a combination comprising at least one of the foregoing.

The gate can comprise three or more layers. For example, the figures illustrate that the gate can comprise lower gate portion 20, upper gate portion 24, and middle layer 22 located in between lower gate portion 20 and upper gate portion 24. For example, lower gate portion 20 can comprise a work function metal (such as aluminum carbide, titanium aluminide, or titanium aluminum carbide). Upper gate portion 24 can comprise tungsten, titanium, aluminum, or a combination comprising at least one of the foregoing. Specifically, upper gate portion 24 can comprise tungsten.

Middle layer 22 can act as a barrier between lower gate portion 20 and upper gate portion 24. Middle gate layer 22 can comprise a metal nitrate. For example, middle gate layer 22 can comprise titanium aluminum nitride or titanium nitrate (TiN), specifically, titanium nitrate.

The gate material can be doped, for example, by an in-situ doping deposition process, ion implantation, or annealing. The gate material can be doped with As, P, B, Sb, Bi, In, Al, Ga, Ti, or a combination comprising at least one of the foregoing. The dopant can be present in the gate material in an amount of $1 \times 10^{14}$ to $1 \times 10^6$ atoms per centimeters squared (atoms/cm$^2$), specifically, $1 \times 10^{15}$ to $5 \times 10^{15}$ atoms per centimeters squared.

The gate material can be deposited, for example, by physical vapor deposition, chemical vapor deposition, or evaporation. The thickness, i.e., height, of the gates can be 20 to 180 nanometers, specifically, 40 to 150 nanometers. The gate material can comprise, for example, physical vapor deposition, chemical vapor deposition, or evaporation.

The gate can have a thickness of less than or equal to 10 nanometers, specifically, of 3 to 8 nanometers. Lower gate portion 20 and upper gate portion 24 can each independently have a thickness of 0.5 to 7 nanometers, specifically, 0.5 to 2 nanometers. Middle layer 22 can have a thickness of 1 to 7 nanometers, specifically, 2 to 5 nanometers.

Cap 30 (also referred to herein as the gate cap) can be located on the gate and can reduce one or both of the gate to drain or the gate to source capacitance. Cap 30 can be located on one or both of the side walls of the gate and an upper surface opposite from semiconductor substrate 10. Cap 30 can be an insulator and comprise a cap material such as an oxide, a nitride, an oxynitride, or a combination comprising at least one of the foregoing, specifically, cap 30 can comprise silicon nitride (SiN).

Cap 30 can be formed by a deposition process, such as a by using a high density plasma, and optional followed by polishing, for example, by chemical and mechanical polishing to planarize the surface. A width of cap 30 on the side walls of the gate can be 15 to 80 nanometers.

Contact regions can be located in between one or more gates. The contact regions can provide an electrical connection with an active region of the semiconductor substrate (such as a source or a drain) to a second component located above the surface. The contact regions can be formed by forming a trench in between gate structures and filling the trench with a conductive material, such as a metal (for example, comprising tungsten, titanium, aluminum, or a combination comprising at least one of the foregoing, specifically, tungsten).

Prior to depositing the conductive material, a liner material can be deposited, such as titanium nitride. For example, the figures illustrate that first liner layer 40 can be deposited prior to silicide layer 42 and that second liner layer 44 can be deposited prior to deposition of contact region 46. The liner material can comprise a metal nitrate. For example, first liner layer 40 and second liner layer 44 can each independently comprise titanium aluminum nitride or titanium nitrate. First liner layer 40 and second liner layer 44 can comprise titanium nitrate.

The gates can be located in one or more interlayer dielectric layers. For example, FIG. 1 illustrates that first dielectric oxide layer 60 is located on semiconductor substrate 10 and that second dielectric oxide layer 62 is located on first dielectric oxide layer 60. The dielectric layers can each independently be deposited by, for example, chemical vapor deposition, ALD, or PECVD. The thickness of the dielectric layers can each independently be 10 to 500 nanometers.

An upper surface of the gate structure of FIG. 1 can be polished, for example, to planarize the surface, for example, by chemical and mechanical polishing.

In order to minimize the capacitance after formation of the contacts, a portion of the interlayer dielectric layer can be replaced with a low dielectric constant dielectric material. For example, FIGS. 2-5 illustrate that a portion of second dielectric oxide layer 62 can be replaced with the low dielectric constant dielectric material to form low dielectric constant dielectric layer 64.

The method comprises removing at least a portion of an interlayer dielectric layer to expose a top surface of a gate cap located on a substrate; recessing the gate cap to form a recessed area; depositing a low dielectric constant oxide having a dielectric constant of less than 3.9 in the recessed area; and polishing a surface of the low dielectric constant oxide to expose a contact area.

Figure 2:
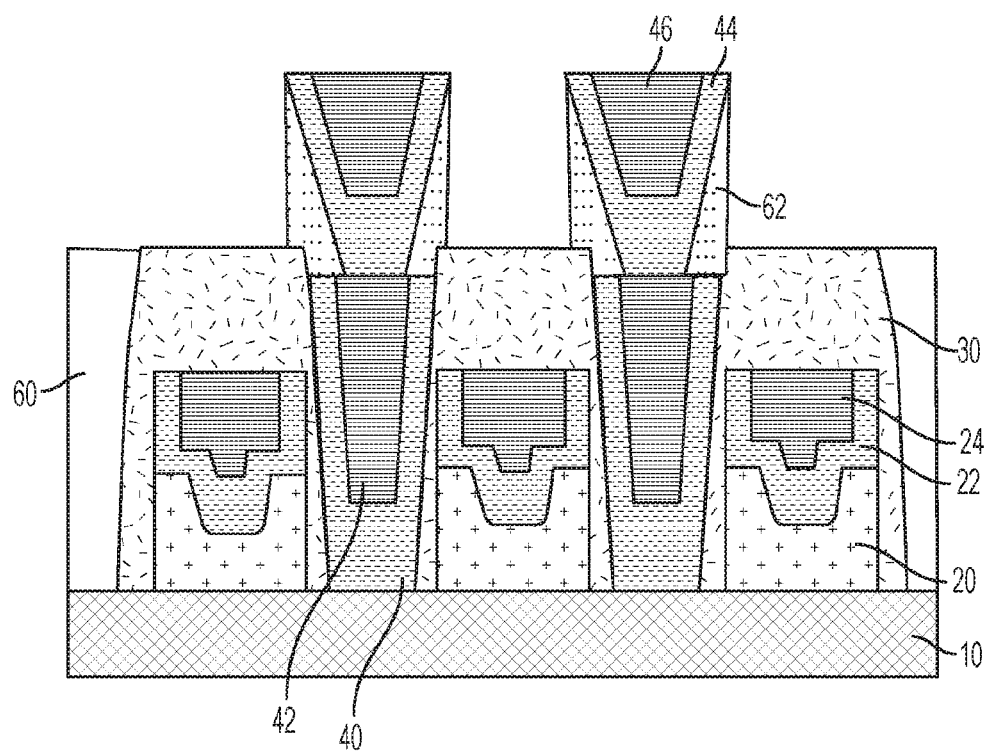
FIG. 2 is an illustration of an embodiment of a self-aligned gate cap with a portion of the second dielectric oxide layer removed.

FIG. 2 illustrates that a portion of an interlayer dielectric layer such as a portion of second dielectric oxide layer 62 can be removed to expose a top surface of cap 30. This removal can be performed using an etching process, for example, with or without a block mask. Non-limiting examples of suitable etching processes include silicon etching methods selective to oxides. The etching process can be a dry etching process. The etching process can be a directional etching process, such as reactive ion etching, a remote plasma, or chemical vapor/sublimation.

The removal of second dielectric oxide layer 62 can remove second dielectric oxide layer 62 such that a surface of cap 30 opposite semiconductor substrate is exposed. An unremoved portion of second dielectric oxide layer 62 that was masked by contact region 46 and second liner layer 44 can remain.

Figure 3A:
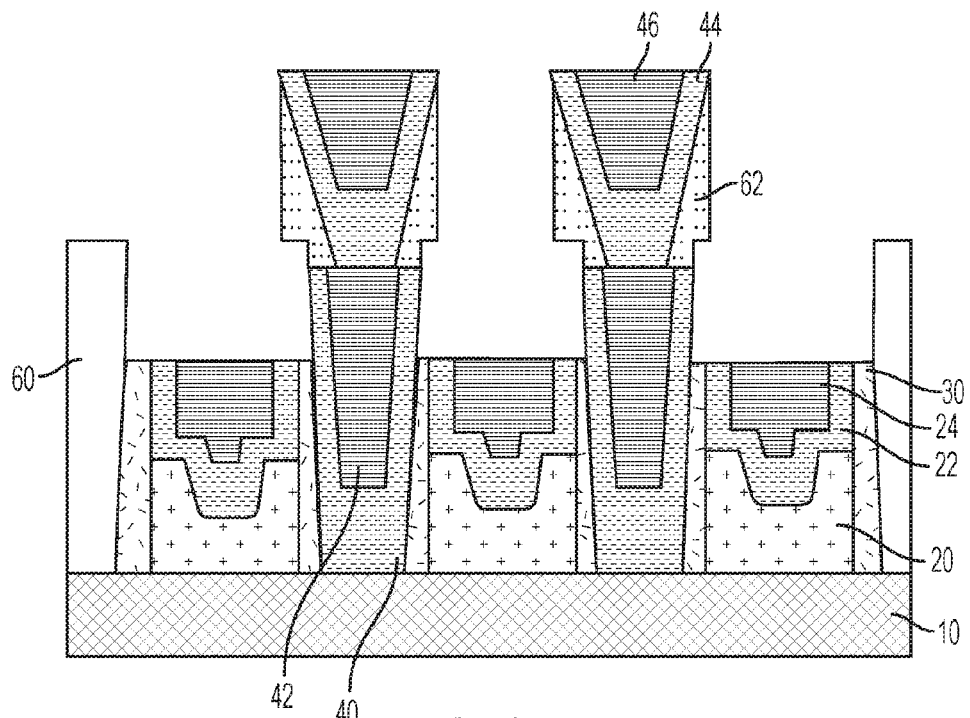
FIG. 3a is an illustration of an embodiment of a self-aligned gate cap with a portion of the cap removed to expose a top of the gate.
Figure 3B:
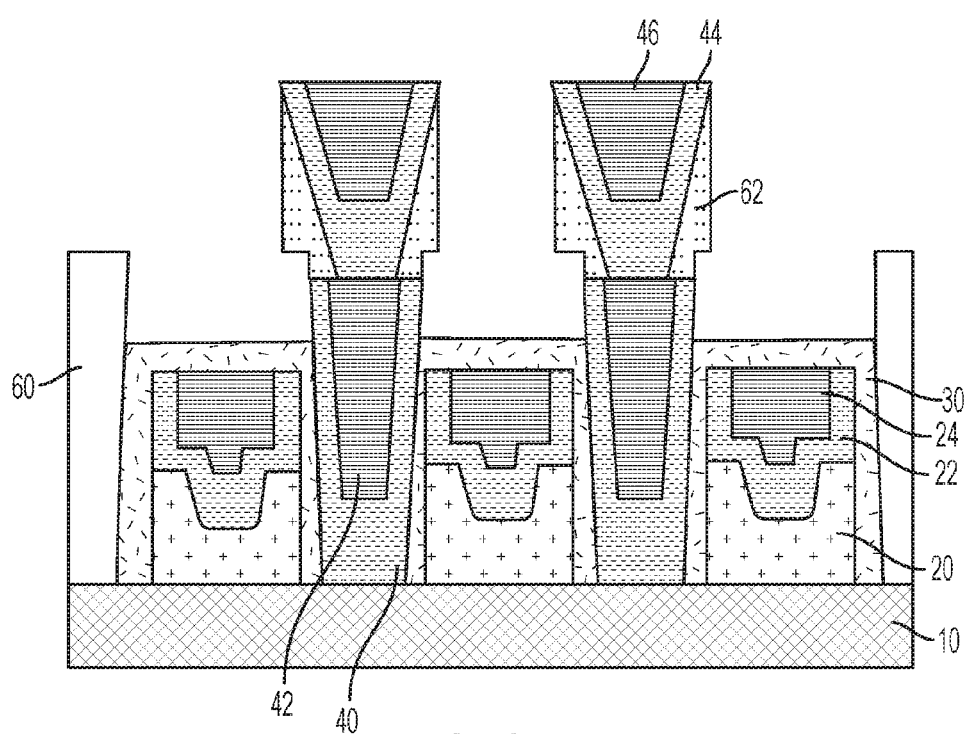
FIG. 3b is an illustration of an embodiment of a self-aligned gate cap with a portion of the cap removed to maintain a protected gate.

FIG. 3*a* and FIG. 3*b* illustrate that after removal of the portion of second dielectric oxide layer 62, a portion of cap 30 can be removed.

FIG. 3*a* illustrates that the removal of cap 30 can remove cap 30 such that a surface of the gate opposite semiconductor substrate is exposed. This embodiment is referred to herein as the gate-dielectric structure. Recessing cap 30 to the top of the gate to form the gate-dielectric structure, as illustrated in FIG. 3*a* can beneficially result in an increased capacitance reduction, for example, as compared to the protected gate structure as the amount of material replaced with the low dielectric constant material is increased.

FIG. 3*b* illustrates that the removal of cap 30 can remove cap 30 such that a surface of the gate opposite semiconductor substrate is not exposed and a layer of cap 30 covers the gate. The embodiment is herein referred to as the protected cap structure. The thickness of the cap remaining on the gate can be 1 to 20 nanometers, specifically, 1 to 10 nanometers, or 5 to 15 nanometers. Recessing cap 30 such that a portion of the cap remains covering the top of the gate to form the protected gate structure as illustrated in FIG. 3*b* can be beneficial if there is leakage across the low dielectric constant material, for example, if the low dielectric constant layer has a high porosity.

The portion of cap 30 can be removed by a recessing step specific to the cap material. The recessing step can comprise one or both of a dry and a wet recessing step. For example, the recessing can comprise recessing with hydrogen fluoride diluted with ethylene glycol (HFEG). Whether the recessing step exposes the top of the gate can be determined, for example, by limiting an exposure time of the cap material during the recessing.

Figure 4A:
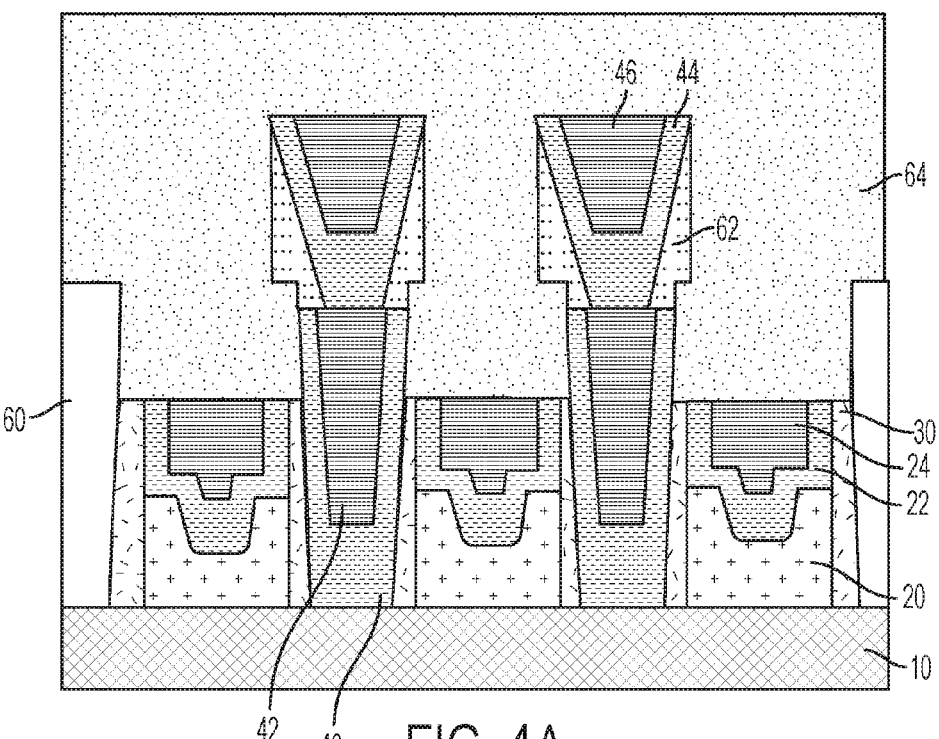
FIG. 4a is an illustration of an embodiment of a self-aligned gate cap with a low dielectric constant material deposited to form a gate-dielectric contact.
Figure 4B:
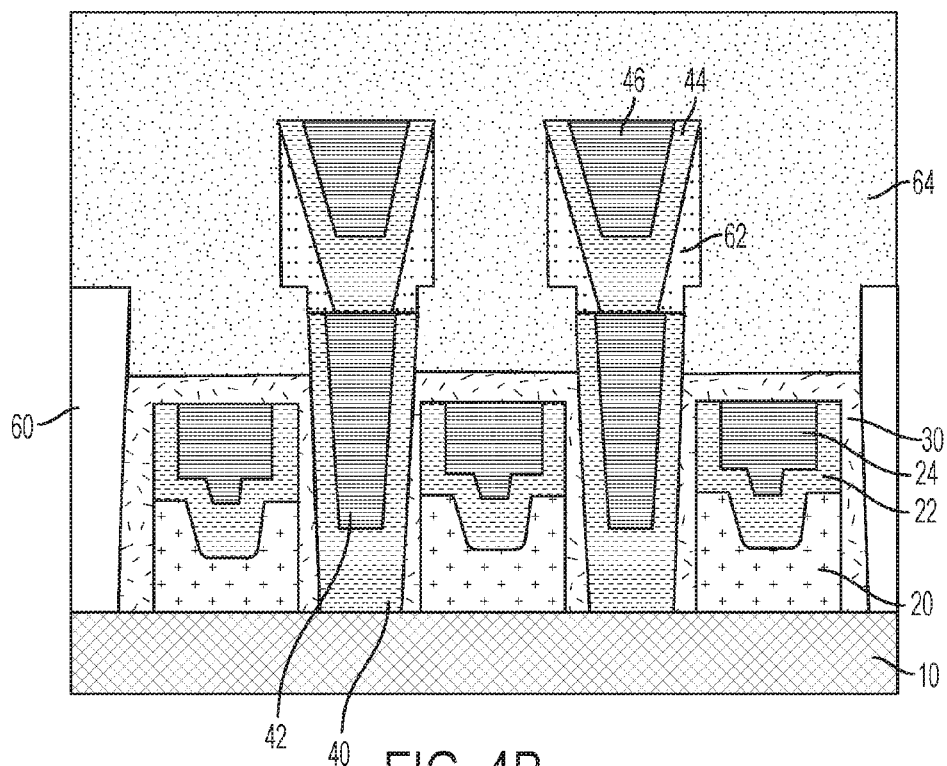
FIG. 4b is an illustration of an embodiment of a self-aligned gate cap with a low dielectric constant material deposited on the protected gate.

FIG. 4*a* and FIG. 4*b* illustrate that after removal of the portion of cap 30, that a low dielectric constant material can be deposited for the gate-dielectric structure and the protected gate structure, respectively. The low dielectric constant material can have a dielectric constant of that is less than the dielectric constant of silicon dioxide. The low dielectric constant material can have a dielectric constant of that is less than 3.9, specifically, 2.5 to 3.8, more specifically, 2.8 to 3.5.

The low dielectric constant material can comprise a doped silicon dioxide, such as silicon dioxide doped with fluorine, carbon, hydrogen, or a combination comprising at least one of the foregoing. The dopant can be present in an amount of 1 to 25 atomic percent, specifically, 5 to 15 atomic percent. The low dielectric constant material can be deposited by chemical vapor deposition or by spin coating.

The low dielectric constant material can be a porous oxide material. The porous oxide material can have a porosity of greater than 0, for example, 0.01 to 0.6. The porous oxide material can comprise a porous silicon dioxide. The porous silicon dioxide can be formed by depositing a silicon carbide, etching the silicon carbide to form a porous silicon carbide, and oxidizing to form the porous silicon dioxide.

Figure 5A:
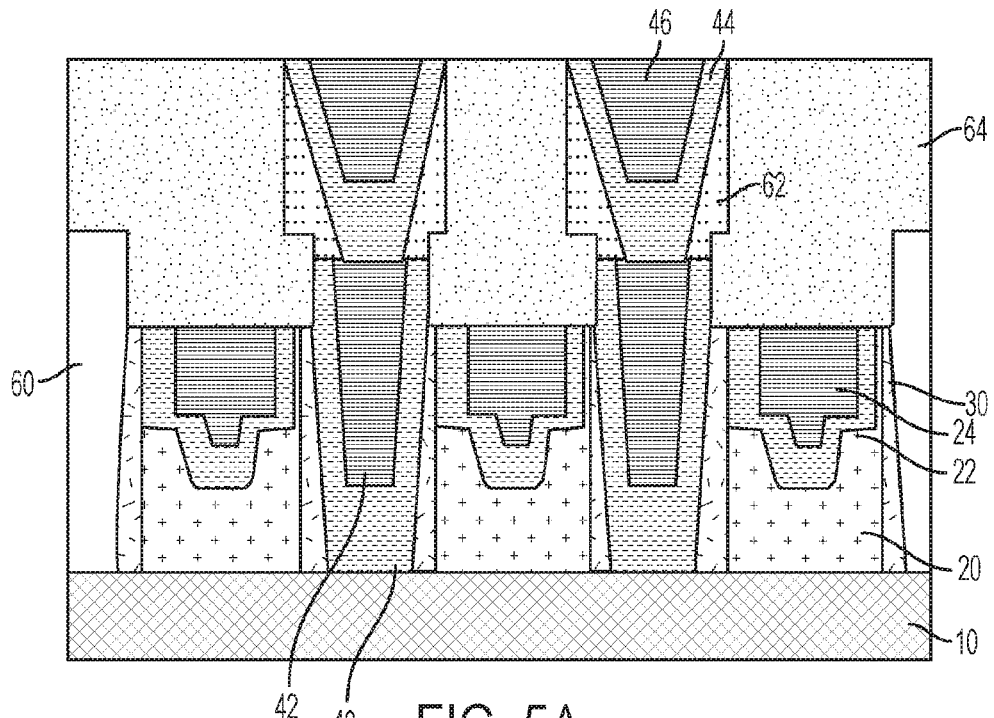
FIG. 5a is an illustration of an embodiment of a self-aligned gate cap with a polished surface.
Figure 5B:
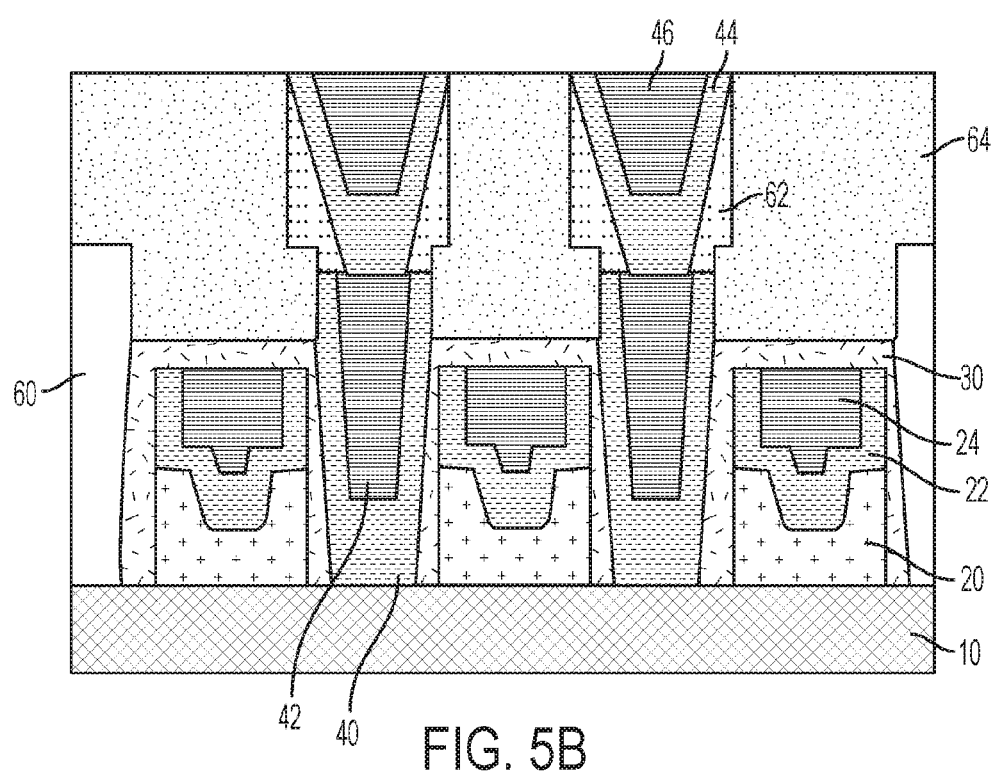
FIG. 5b is an illustration of an embodiment of a self-aligned gate cap with a polished surface.

FIG. 5*a* and FIG. 5*b* illustrate that the surface of the self-aligned contact can be polished, for example, to planarize the surface, for the gate-dielectric structure and the protected gate structure, respectively. The polishing can be accomplished, for example, by chemical and mechanical polishing. The planarization can be completed upon exposal of contact area 46.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular. "or" means "and/or".

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the disclosure and the practical application, and to enable others of ordinary skill in the art to understand the invention for various embodiments with various modifications as are suited to the particular use contemplated.

The diagrams depicted herein are just examples. There may be many variations to this diagram or the steps (or operations) described therein without departing from the spirit of the invention. For instance, the steps may be performed in a differing order or steps may be added, deleted or modified. All of these variations are considered a part of this disclosure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a self-aligned contact, comprising:

forming a gate on a substrate, the gate comprising a lower gate portion formed directly on the substrate, a middle gate layer formed directly on the lower gate portion, and an upper gate portion formed directly on middle gate layer;

wherein the middle gate layer is of a different material than the lower and upper gate portions;

wherein a gate cap is located directly on the substrate and on a top surface of the gate, the gate cap being formed directly on sidewalls of the middle gate layer and directly on sidewalls of the lower gate portion, the gate cap being formed directly on top surfaces of both the upper gate portion and the middle gate layer;

forming a conductive contact on the substrate and adjacent to the gate, the conductive contact comprising a liner layer around a silicide layer, a bottom surface of the liner layer being formed directly on the substrate;

wherein the liner layer is directly on sides of the gate cap, wherein a width of the gate cap is inverse to a width of the liner layer such that the width of the gate cap narrows as the width of the liner layer widens and the width of the gate cap widens as the width of the liner layer narrows;

after forming the conductive contact, removing at least a portion of an interlayer dielectric layer to expose a top surface of the gate cap located on the substrate and on the top surface of the gate;

partially recessing the gate cap to form a recessed area such that the top surface of the gate is not exposed, the recessed gate cap comprising a thickness of 1 to 20 nanometers on the top surface of the gate, the liner layer vertically extending above a top surface of the gate cap after recessing the gate cap;

depositing a low dielectric constant oxide having a dielectric constant of 2.8 to 3.5 on a surface of the partially recessed gate cap in the recessed area; and polishing a surface of the low dielectric constant oxide to expose a surface of the conductive contact;

wherein removing at least a portion of an interlayer dielectric layer comprises dry etching the interlayer dielectric layer;

wherein the low dielectric constant oxide comprises a porous silicon dioxide or a doped silicon dioxide.

* * * * *